(12) United States Patent
Nosaka et al.

(10) Patent No.: US 12,101,018 B2
(45) Date of Patent: Sep. 24, 2024

(54) DRIVING CIRCUIT FOR SWITCHING ELEMENT AND SWITCHING CIRCUIT

(71) Applicant: OMRON Corporation, Kyoto (JP)

(72) Inventors: Noriyuki Nosaka, Nara (JP); Wataru Okada, Kizugawa (JP); Hironori Nakada, Nara (JP); Satoshi Iwai, Hirakata (JP)

(73) Assignee: OMRON CORPORATION, Kyoto (JP)

( * ) Notice: Subject to any disclaimer, the term of this patent is extended or adjusted under 35 U.S.C. 154(b) by 527 days.

(21) Appl. No.: 17/272,706

(22) PCT Filed: Mar. 13, 2019

(86) PCT No.: PCT/JP2019/010310
§ 371 (c)(1),
(2) Date: Mar. 2, 2021

(87) PCT Pub. No.: WO2020/084806
PCT Pub. Date: Apr. 30, 2020

(65) Prior Publication Data
US 2021/0367499 A1    Nov. 25, 2021

(30) Foreign Application Priority Data
Oct. 26, 2018    (JP) .................................. 2018-201843

(51) Int. Cl.
*H02M 1/00*    (2007.01)
*H02M 1/08*    (2006.01)
(Continued)

(52) U.S. Cl.
CPC ........... *H02M 1/0054* (2021.05); *H02M 1/08* (2013.01); *H02M 3/33592* (2013.01);
(Continued)

(58) Field of Classification Search
CPC .. H02M 1/0054; H02M 1/08; H02M 3/33592; H03K 17/04123; H03K 17/162; H03K 17/687; H03K 17/74
(Continued)

(56) References Cited

U.S. PATENT DOCUMENTS 4,527,228 A * 7/1985 Chi Yu ................... H03K 17/13
363/41
11,196,413 B2 * 12/2021 Nosaka ................... H02M 1/08
(Continued)

FOREIGN PATENT DOCUMENTS

CN    102498668 A    6/2012
JP    S59138911 U    9/1984
(Continued)

OTHER PUBLICATIONS

International Search Report issued in Intl. Appln. No. PCT/JP2019/010310 mailed Jun. 4, 2019. English translation provided.
(Continued)

*Primary Examiner* — Yemane Mehari
(74) *Attorney, Agent, or Firm* — ROSSI, KIMMS & McDOWELL LLP

(57) ABSTRACT

A driving circuit for a switching element that drives a switching element of a current-driven type. The driving circuit includes a controller including a first terminal and a second terminal and that outputs a control signal to a gate terminal of the switching element. A first resistor, which regulates a current serving as the control signal, is connected to the first terminal, and a first capacitor is connected in parallel to the first resistor. A second resistor and a second capacitor are connected in parallel, and a current path extends from the first resistor and the first capacitor to the gate terminal and from a source terminal of the switching
(Continued)

element to the second terminal of the controller. The second resistor and the second capacitor are in the current path.

8 Claims, 21 Drawing Sheets

(51) Int. Cl.
    *H02M 3/335*      (2006.01)
    *H03K 17/0412*      (2006.01)
    *H03K 17/16*      (2006.01)
    *H03K 17/687*      (2006.01)
    *H03K 17/74*      (2006.01)

(52) U.S. Cl.
    CPC ..... *H03K 17/04123* (2013.01); *H03K 17/162* (2013.01); *H03K 17/687* (2013.01); *H03K 17/74* (2013.01)

(58) Field of Classification Search
    USPC .......................................................... 323/271
    See application file for complete search history.

(56) References Cited

U.S. PATENT DOCUMENTS

| | | | |
|---|---|---|---|
| 2010/0283515 A1 | 11/2010 | Kelley | |
| 2012/0153998 A1* | 6/2012 | Kitamura | H03K 17/04106 327/109 |
| 2012/0218011 A1 | 8/2012 | Kelley | |
| 2012/0306545 A1* | 12/2012 | Machida | H02M 3/1588 327/109 |
| 2016/0261266 A1* | 9/2016 | Kampl | H03K 17/165 |
| 2016/0352321 A1* | 12/2016 | Yamaguchi | H03K 17/08122 |
| 2021/0242867 A1* | 8/2021 | Nosaka | H03K 17/162 |
| 2021/0320653 A1* | 10/2021 | Nosaka | H02M 1/08 |
| 2021/0367499 A1* | 11/2021 | Nosaka | H02M 1/08 |

FOREIGN PATENT DOCUMENTS

| | | |
|---|---|---|
| JP | 2010051165 A | 3/2010 |
| JP | 2012527178 A | 11/2012 |
| JP | 2013026924 A | 2/2013 |
| JP | 2013099133 A | 5/2013 |
| JP | 2013243877 A | 12/2013 |
| JP | 2014093586 A | 5/2014 |
| JP | 2017118717 A | 6/2017 |
| JP | 2018007201 A | 1/2018 |
| WO | 2017038390 A1 | 3/2017 |
| WO | WO-2020035712 A1 * | 2/2020 |

OTHER PUBLICATIONS

Written Opinion issued in Intl. Appln. No. PCT/JP2019/010310 mailed Jun. 4, 2019. English translation provided.

Extended European search report issued in European Appln. No. 19875624.9 mailed on Apr. 4, 2022.

Office Action issued in Chinese Appln. No. 201980054098.X mailed Dec. 1, 2023. English translation provided.

* cited by examiner

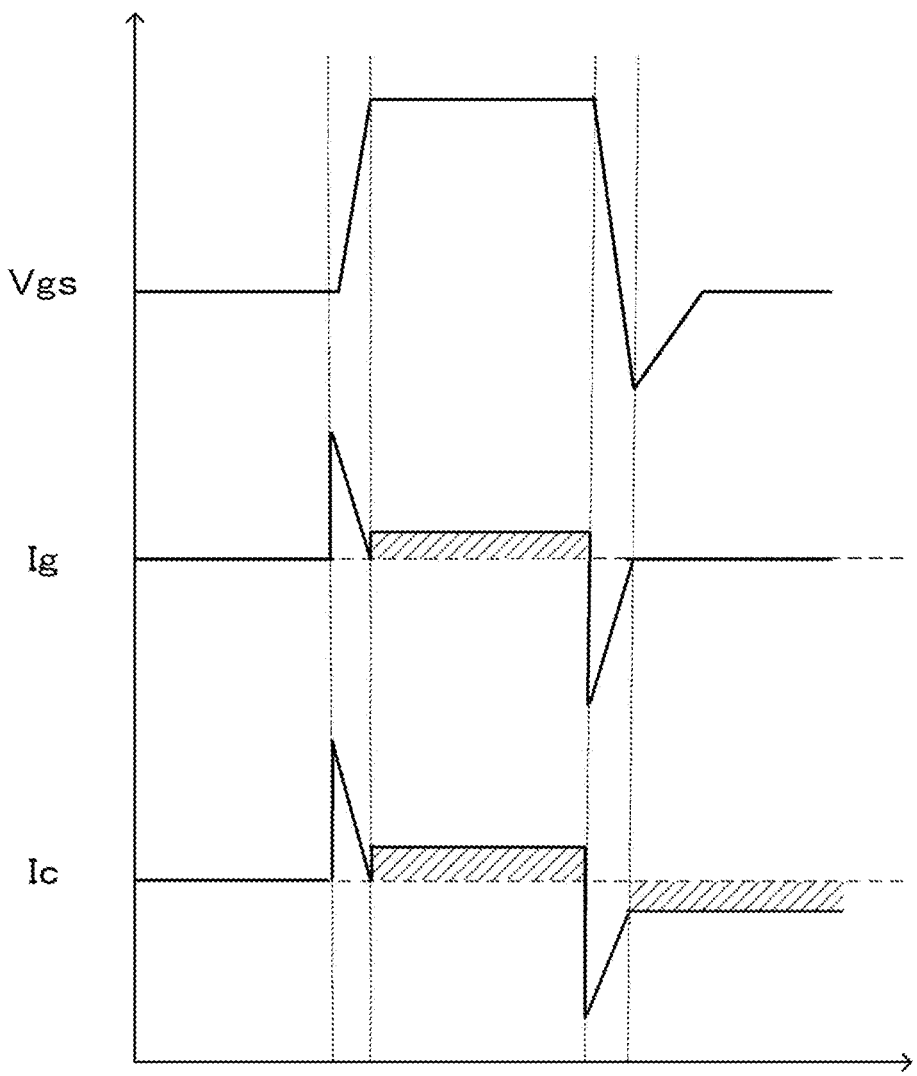

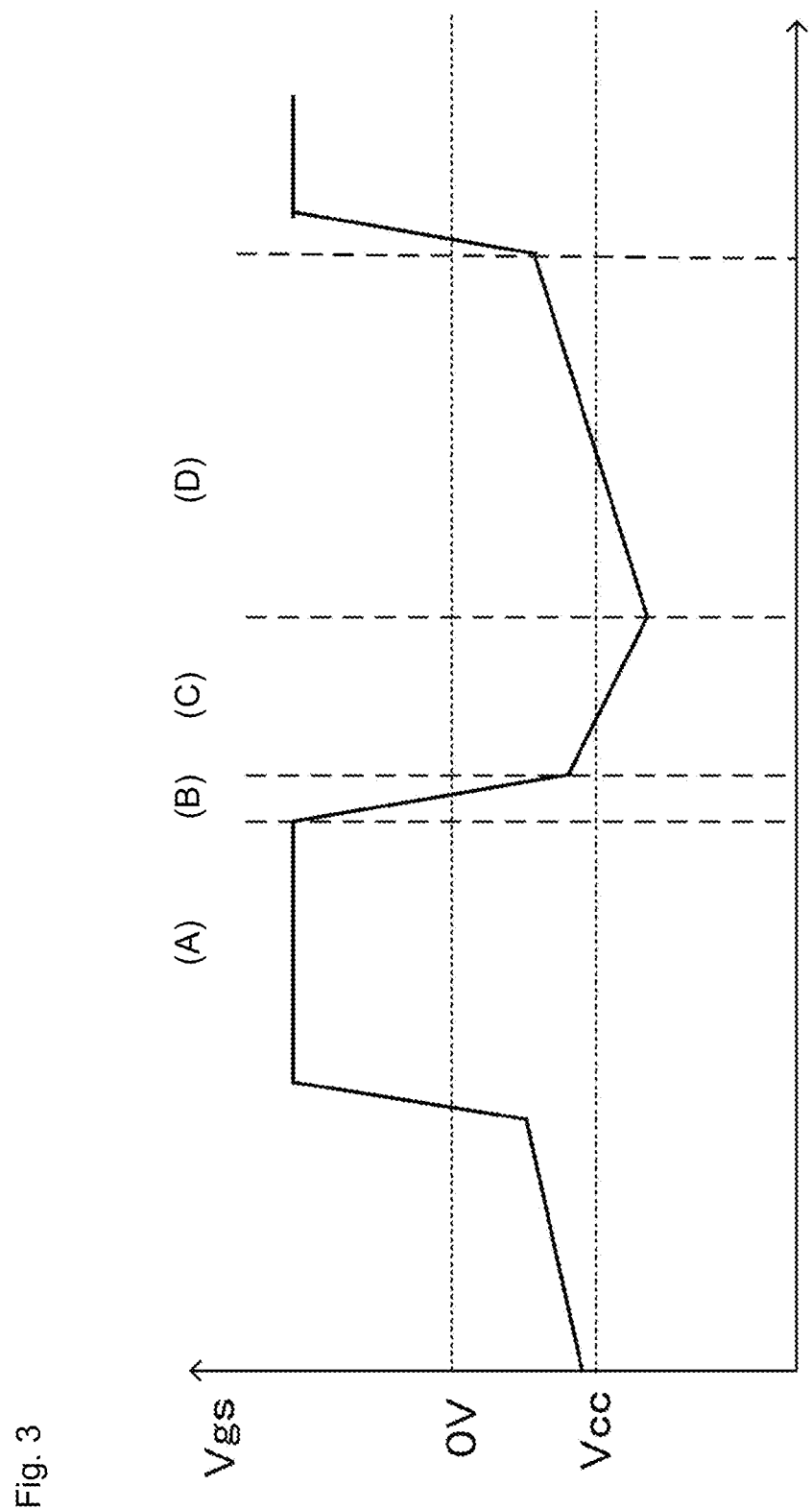

DRIVING CIRCUIT FOR SWITCHING ELEMENT AND SWITCHING CIRCUIT

TECHNICAL FIELD

The present invention relates to a driving circuit for a switching element and more particularly, to a driving circuit for a switching element of a current-driven type and a switching circuit including the driving circuit.

BACKGROUND ART

A technique in which a JFET or the like made from silicon carbide (SiC) is used as a switching element in a power converter or the like has been proposed in the related art. In a driving circuit for such a switching element, in order to prevent malfunctions, a capacitor is provided between a gate and source of the switching element, the capacitor being larger in capacitance than a stray capacitance generated between the drain and the gate. Further, in order to prevent malfunctions, a technique for applying negative bias by using a speed-up capacitor CgD has been proposed (see, for example, Patent Document 1). Similarly, a technique for applying negative bias by using a Zener diode has been proposed (see, for example, Patent Document 2).

The application of negative bias for a driving circuit for the above-described switching element known in the related art may cause an unwanted phenomenon where a reverse conduction loss due to an internal diode of the switching element increases in proportion to a negative bias voltage. The reverse conduction loss is also proportional to a frequency; therefore, when a switching frequency is increased, the increase in reverse conduction loss becomes a problem.

PRIOR ART DOCUMENTS

Patent Documents

Patent Document 1: Japanese Unexamined Patent Publication No. 2013-99133
Patent Document 2: Japanese Unexamined Patent Publication No. 2014-93586

SUMMARY OF THE INVENTION

Problems to be Solved by the Invention

The present invention has been made in view of the above-described problems, and it is therefore an object of the present invention to provide a technique for allowing a driving circuit for a switching element to reduce a loss due to a negative bias voltage.

Means for Solving the Problem

Provided according to the present invention for solving the above-described problems is a driving circuit for a switching element configured to drive a switching element of a current-driven type, the driving circuit for a switching element including a controller having a first terminal and a second terminal, the controller being configured to output a control signal to a gate terminal of the switching element, a first resistor connected to the first terminal of the controller, the first resistor regulating a current serving as the control signal, a first capacitor connected in parallel to the first resistor, a second resistor, a second capacitor connected in parallel to the second resistor, and a current path extending from the first resistor and the first capacitor to the gate terminal and from a source terminal of the switching element to the second terminal of the controller, and the second resistor and the second capacitor are put in the path.

According to the present invention, input capacitances of the first capacitor, the second capacitor, and the switching element are charged by the current serving as the control signal when the switching element is in the gate-on state, and the electric charge thus stored is discharged via the first resistor and the second resistor when the switching element is in the gate-off state, thereby applying a negative bias voltage to the switching element. The negative bias voltage depends on the duty cycle at which the switching element turns on and off, so that causing the negative bias voltage to change in a manner that depends on the duty cycle allows a reduction in loss.

Further, according to the present invention, when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \qquad [\text{Math. 1}]$$

may be satisfied.

This makes it possible to attenuate the negative bias voltage in two steps. This in turn makes it possible to set the negative bias voltage to prevent sudden changes in voltage and current.

Further, according to the present invention, a third resistor may be connected between the gate terminal and the source terminal of the switching element.

This makes the negative bias voltage variable in a manner that depends on not only the duty cycle, but also the resistance value of the third resistor.

Further, according to the present invention, a third capacitor may be connected between the gate terminal and the source terminal of the switching element.

This makes the negative bias voltage variable in a manner that depends on the capacitance value of the third capacitor. This further makes the switching speed of the switching element variable in a manner that depends on the capacitance value of the third capacitor.

Further, according to the present invention, a mirror clamping circuit may be provided in parallel to a path including the switching element.

This makes it possible to prevent a large voltage such as a surge voltage from being applied to the switching element.

Further, according to the present invention, a fourth resistor connected to the path in series with the first capacitor and in parallel to the first resistor may be provided.

This allows the fourth resistor to reduce a gate surge of the switching element. This further allows a reduction in switching noise caused in the switching element.

Further, according to the present invention, a Schottky diode may be provided, the Schottky diode having a cathode terminal connected to a path adjacent to the first resistor and the first capacitor and an anode terminal connected to a path adjacent to the controller, relative to the second resistor, the second capacitor, and the switching element.

This allows a reduction in gate surge of the switching element. Here, the second resistor and the second capacitor connected in parallel and the switching element are connected in series on the path. The Schottky diode has the cathode terminal and the anode terminal connected to the path across the second resistor and the second capacitor, and the switching element.

Further, according to the present invention, a voltage clamping unit configured to fix a voltage to a predetermined voltage may be connected in parallel to the switching element.

This allows the voltage clamping unit to fix the gate voltage applied to the switching element to a predetermined voltage, thereby allowing a reduction in gate surge.

Here, as the voltage clamping unit, for example, a Zener diode may be used.

Further, provided according to the present invention is a switching circuit including a plurality of switching elements of a current-driven type connected in series, and the driving circuit for a switching element configured to drive each of the plurality of switching elements.

This makes, in the switching elements constituting the switching circuit, the negative bias voltage when the switching element is in the gate-off state variable in a manner that depends on the duty cycle and allows a reduction in loss.

Effect of the Invention

According to the present invention, the driving circuit for a switching element can reduce a loss due to a negative bias voltage.

BRIEF DESCRIPTION OF THE DRAWINGS

FIG. 2 is a diagram showing an operation principle of the gate driving circuit 100 according to the first embodiment.

FIG. 3 is a graph showing a profile of a gate voltage applied to a switching element 1 according to the first embodiment.

MODE FOR CARRYING OUT THE INVENTION

Application Example

Hereinafter, an application example of the present invention will be described with reference to the drawings. The present invention is applied to, for example, a gate driving circuit 100 for a switching element of a current-driven type as shown in FIG. 1.

In the switching element 1, a negative bias voltage is applied to prevent false turn-on when the switching element is in the gate-off state due to, for example, noise generated from another switching element connected in series with the switching element 1.

Figure 21:
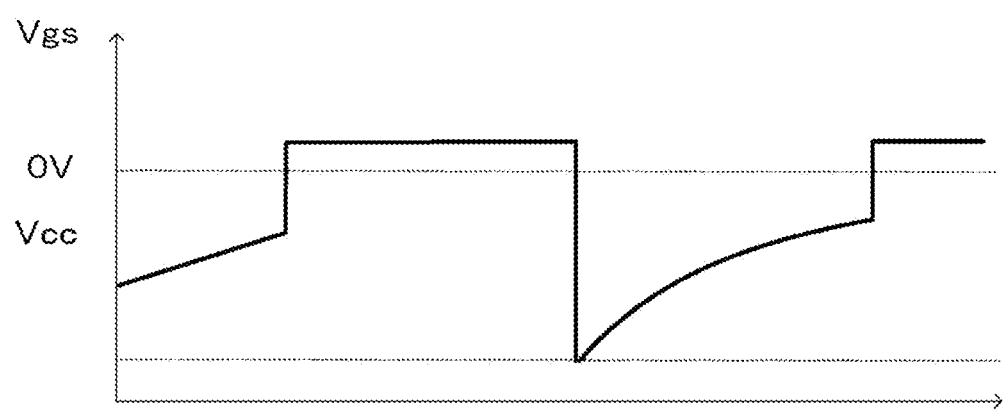
FIG. 21 is a graph showing a profile of a gate voltage applied to a switching element according to an example known in the related art.

As such a negative bias voltage, a voltage having a profile as shown in FIG. 21 is applied across the gate and the source. It is desirable to increase the negative bias voltage in order to prevent false turn-on, but simply increasing the negative bias voltage will lead to an increase in loss, as will be described later. The present invention is therefore intended to reduce a loss by suitably changing the negative bias voltage. At this time, the negative bias voltage may be changed for prevention of malfunctions, which is the primary purpose of applying the negative bias voltage to the switching element.

Figure 1:
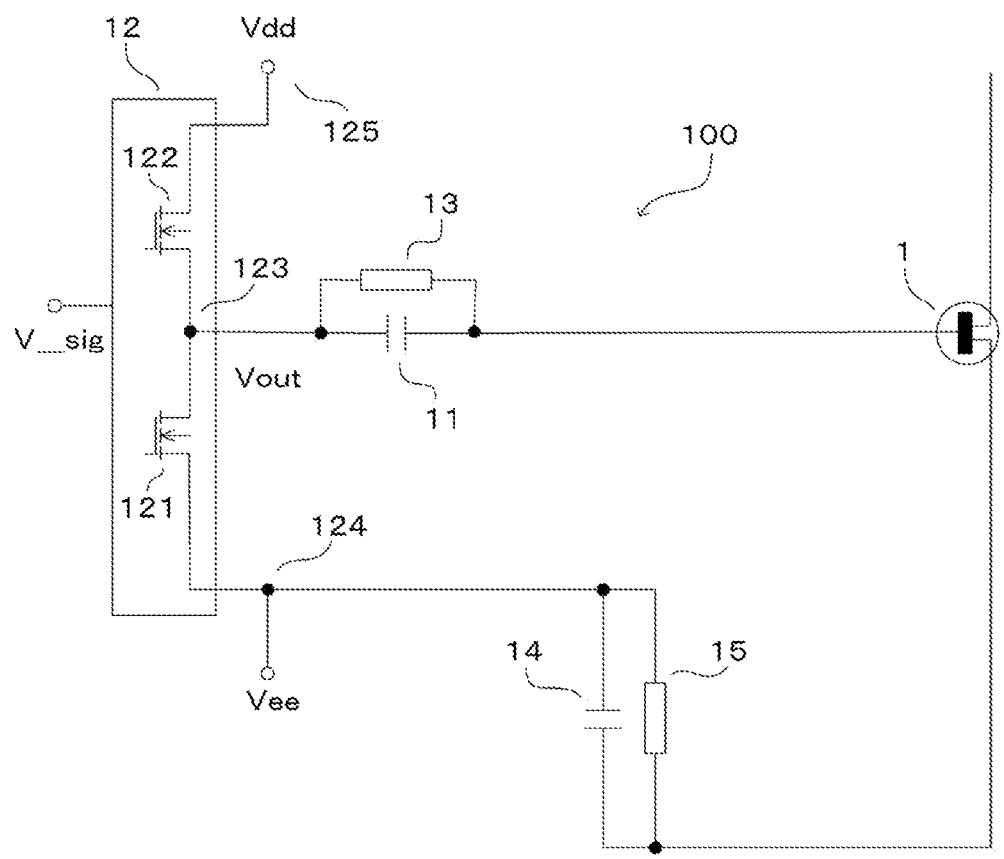
FIG. 1 is a diagram showing a circuit structure of a gate driving circuit 100 according to a first embodiment.

When the negative bias voltage is applied by the gate driving circuit shown in FIG. 1, a gate-source voltage Vgs applied to the switching element has a profile as shown in FIG. 3. According to the present invention, a first resistor regulating a gate current supplied to the switching element and a first capacitor connected in parallel to the first resistor are provided. The first resistor and the first capacitor are referred to as a limiting resistor and a speed-up capacitor, respectively.

A current serving as a control signal output from a controller for controlling the gate of the switching element flows to a gate terminal of the switching element via the limiting resistor and the speed-up capacitor. Then, this current flows to the controller through a source terminal of the switching element. According to the present invention, putting a second resistor and a second capacitor connected in parallel in a current path extending to the controller via the limiting resistor, the speed-up capacitor, and the switching element makes the negative bias voltage variable in a manner that depends on the duty cycle.

The second resistor and the second capacitor may be put at any position on the above-described path. For example, the second resistor and the second capacitor may be interposed between the limiting resistor and the speed-up capacitor, and the gate terminal of the switching element, or may be interposed between the gate terminal of the switching element and the controller.

The speed-up capacitor connected in series with the path, an input capacitance of the switching element, and the second capacitor are charged by the gate current flowing when the switching element is in the gate-on state, and the electric charge thus stored is discharged via the limiting resistor and the second resistor when the switching element is in the gate-off state. The negative bias voltage having the profile shown in FIG. 3 is applied by the discharge of the electric charge stored in the speed-up capacitor, the input capacitance of the switching element, and the second capacitor.

As will be described later, Vcc denoting an average value of the negative bias voltage depends on the duty cycle at which the switching element turns on and off, so that the negative bias voltage is variable in a manner that depends on the duty cycle. Further, Vcc also depends on the resistance value of the second resistor, so that the negative bias voltage is variable in a manner that depends on the resistance value of the second resistor.

The present invention is further applicable to a switching circuit including switching elements connected in series and driven by the driving circuit according to the present invention. In such a switching circuit, even when a surge voltage or noise occurs due to, with a switching element in the off state, complementary turn-on of another switching element, suitably changing the negative bias voltage makes it possible to prevent malfunctions such as false turn-on. Further, even when a large current flows to the switching element, suitably changing the negative bias voltage allows a reduction in loss. As described above, various effects can be brought about by applying, to the switching circuit, the driving circuit in which a bias is variable. Such a switching circuit only needs to be a circuit having a plurality of switching elements connected in series for switching, and examples of the switching circuit include, but are not limited to, a synchronous rectification boost chopper, a DC/DC converter, an inverter, and the like.

First Embodiment

Hereinafter, a gate driving circuit according to an embodiment of the present invention will be described in more detail with reference to the drawings.
<Device Structure>
FIG. 1 shows the gate driving circuit 100 according to the embodiment.

The switching element 1 has a gate terminal connected to a first end of a capacitor 11 serving as a speed-up capacitor. The capacitor 11 has a second end connected to a terminal 123 (hereinafter referred to as "Vout end") from which an output voltage Vout of a driving circuit 12 is output. A resistor 13 serving as a limiting resistor that allows a minute current to flow when the switching element 1 is in the on state is connected in parallel to the capacitor 11. The switching element 1 has a source terminal connected to a first end of a capacitor 14. A resistor 15 is connected in parallel to the capacitor 14. The capacitor 14 has a second end connected to a terminal 124 (hereinafter referred to as "Vee end") of the driving circuit 12. The driving circuit 12 includes two n-channel MOSFETs 121, 122 connected in series between a terminal (hereinafter referred to as "Vdd end") 125 connected to a voltage source Vdd and the Vee end 124. A midpoint between the two MOSFETs 121, 122 is connected to the second end of the capacitor 11 as the Vout end 123. The driving circuit 12 switches the MOSFETs 121, 122 between on and off in accordance with an input signal V_sig. Bringing the MOSFET 121 into the on state and bringing the MOSFET 122 into the off state cause the second end of the capacitor 11 to electrically connect to the Vdd end 125 via the Vout end 123 to allow a gate current to flow to the switching element 1 via the capacitor 11 and the resistor 13. Then, bringing the MOSFET 121 into the off state and bringing the MOSFET 122 into the on state cause the second end of the capacitor 11 to electrically connect to the Vee end 124 and the second end of the capacitor 14 via the Vout end 123 to apply the negative bias across the gate and source of the switching element 1. Here, the capacitor 11 serves as the first capacitor, the resistor 13 serves as the first resistor, the capacitor 14 serves as the second capacitor, the resistor 15 serves as the second resistor, the driving circuit 12 serves as the controller, the Vout end 123 serves as a first terminal, and the Vee end 124 serves as a second terminal. Further, a circuit connected from the capacitor 11 and the resistor 13 to the gate terminal of the switching element 1 and from the source terminal of the switching element 1 to the driving circuit 12 corresponds to the path. Further, a current input into the gate terminal of the switching element 1 by switching the MOSFETs 121, 122 of the driving circuit 12 between on and off corresponds to the control signal.
<Operation Principle>
FIG. 2 shows the voltage (gate voltage) Vgs applied across the gate and source terminals of the switching element 1, a current Ig flowing to the gate terminal of the switching element 1, and a current Ic flowing to the capacitor 14. When a JFET is used as the switching element 1, the gate and source of the JFET are in ohmic contact, so that a current Igon constantly flows to the gate terminal in the turn-on state. This is expressed by:

$$\text{Igon} = (Vdd - Vdev - Vcc)/\text{Rig} \qquad [\text{Math. 2}]$$

where Vdev denotes a voltage applied across the gate terminal and the source terminal in the turn-on state, and Rig denotes a resistance value of the resistor 13.

At this time, in the gate driving circuit 100, the current Ic flows to the capacitor 14.

When an electric charge stored in the capacitor 14 is denoted by Qcharge and an electric charge discharged from the capacitor 14 is denoted by Qdischarge, that the stored electric charge and the discharged electric charge are equal to each other is expressed by the following equation (1): This means that in a waveform of Ic shown in FIG. 2, two shaded regions surrounded by Ic and a coordinate axis are equal in area to each other.
[Math. 3]

$$Q\text{charge} = Q\text{discharge} \qquad (1)$$

When the average value of the negative bias voltage is denoted by Vcc, the duty cycle is denoted by D, the frequency is denoted by f, the resistance value of the resistor 15 is denoted by R, and the charging current of the capacitor 14 in the turn-on state is denoted by Ic:

$$Q\text{charge} = \int Ic\, dt \qquad [\text{Math. 4}]$$

$$Q\text{discharge} = \int (Vcc/R)\, dt \qquad [\text{Math. 5}]$$

are satisfied. Therefore, the equation (1) can be expressed by:

$$\int Ic\, dt = \int (Vcc/R)\, dt \qquad [\text{Math. 6}].$$

Integrating both sides results in:
[Math. 7]

$$Ic*D/f=(Vcc/R)*(1-D)/f \qquad (2).$$

Rearrangement of the equation (2) for Vcc results in:
[Math. 8]

$$Vcc=R*Ic*D/(1-D) \qquad (3).$$

Therefore, the negative bias voltage value Vcc is variable in a manner that depends on the duty cycle D and the resistance value R of the resistor 15.

A detailed description will be given below of the operation principle of the gate driving circuit 100.

FIG. 3 shows a profile of the gate voltage Vgs applied to the switching element 1 driven by the gate driving circuit 100.

An input capacitance of the capacitor 11, an input capacitance of the capacitor 14, and an input capacitance of the switching element 1 are denoted by C1, C2, and Ciss, respectively, and the gate-source voltage in the turn-on state is denoted by Vdev. As described above, Vdd denotes the gate source voltage, Vgs denotes the gate voltage, and Vcc denotes the negative bias voltage value.

Figure 4A:
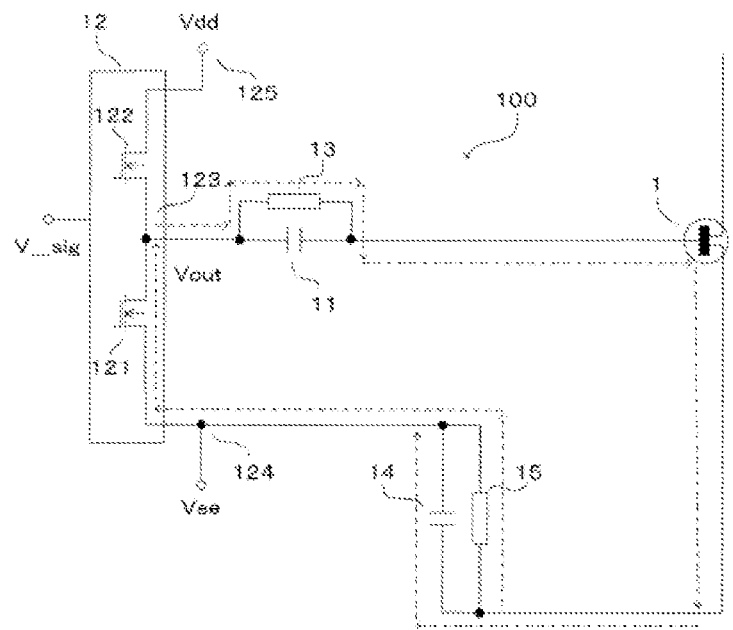
FIGS. 4A and 4B are diagrams showing, in a period (A), a current flow and a simple equivalent circuit of the driving circuit 100.
Figure 4B:
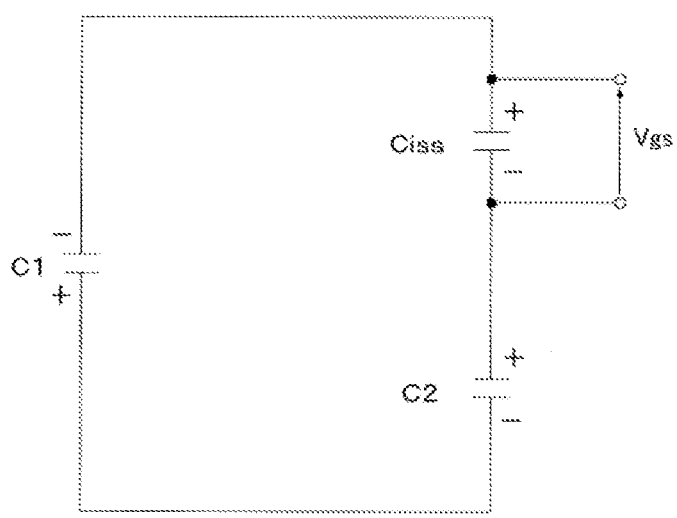

First, since the switching element 1 is a JFET, a steady-state on-current flows in a period, denoted by (A), when the gate is on. FIG. 4B shows a simple equivalent circuit, in this period, of a current flow path represented by dashed lines with arrows on the gate driving circuit 100 shown in FIG. 4A. At this time, an electric charge with polarities shown in the simple equivalent circuit of FIG. 4B is stored in the input capacitance of the capacitor 11, the input capacitance of the capacitor 14, and the input capacitance of the switching element 1.

Next, in a period denoted by (B), until the electric charge in the input capacitance of the capacitor 11, the electric charge in the input capacitance of the capacitor 14, and the electric charge in the input capacitance of the switching element 1 are in balance, charging and discharging of the electric charge continues. The input capacitance Ciss of the switching element 1 is charged in the negative direction, so that Vgs becomes small.

At this time, the gate voltage decreases in two steps by satisfying the following condition:

$$\frac{1}{Ciss} * \frac{1}{\left(\frac{1}{C1}+\frac{1}{C2}+\frac{1}{Ciss}\right)} < \frac{Vcc+Vdev}{Vdd}. \qquad \text{[Math. 9]}$$

Figure 5A:
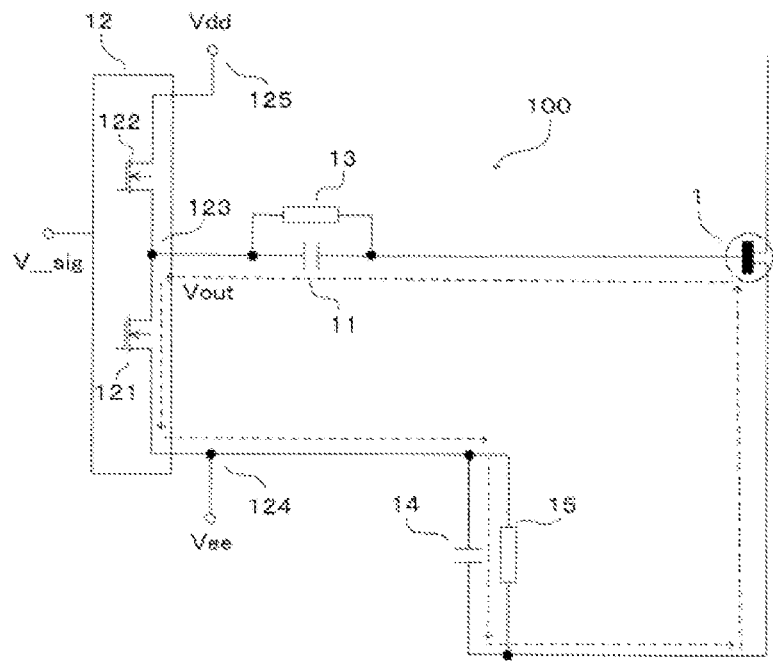
FIGS. 5A and 5B are diagrams showing, in a period (B), a current flow and a simple equivalent circuit of the driving circuit 100.
Figure 5B:
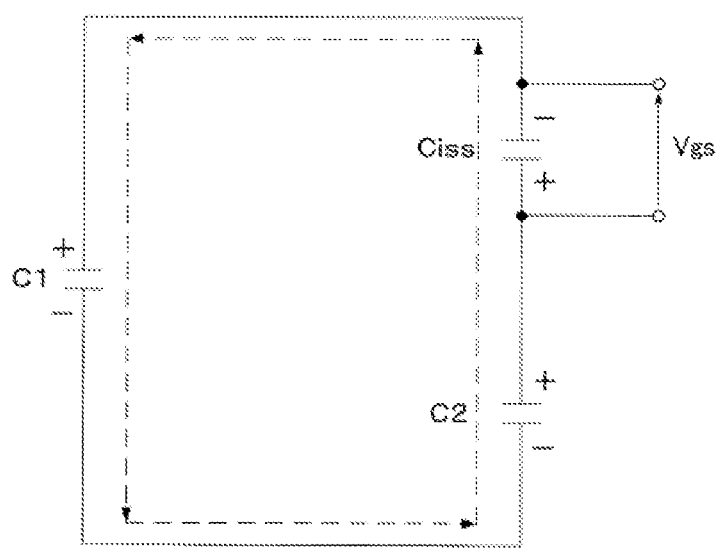

FIG. 5B shows a simple equivalent circuit, in this period, of a current flow path represented by dashed lines with arrows on the gate driving circuit shown in FIG. 5A. The polarities of the electric charges in the input capacitances of the capacitor 11, the capacitor 14, and the switching element 1 are shown in the simple equivalent circuit of FIG. 5B. Here, the current in the simple equivalent circuit is represented by dashed lines with arrows.

Figure 6A:
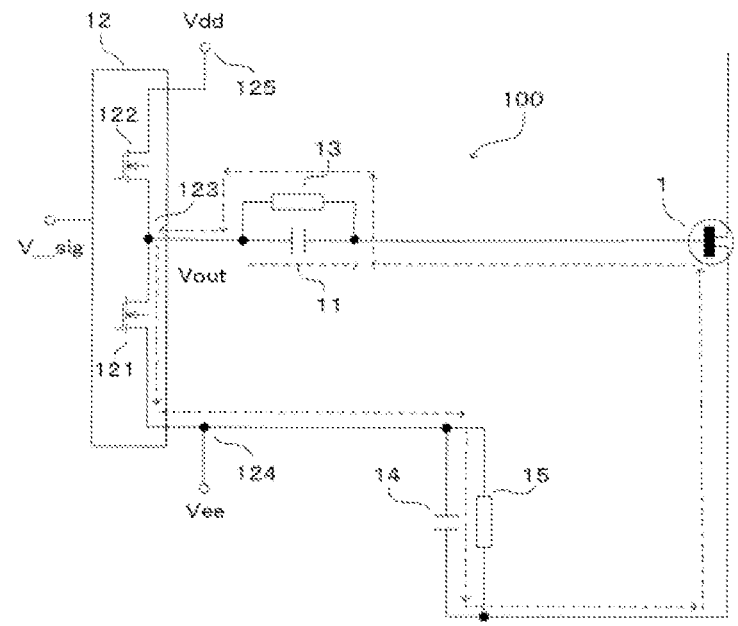
FIGS. 6A and 6B are diagrams showing, in a period (C), a current flow and a simple equivalent circuit of the driving circuit 100.
Figure 6B:
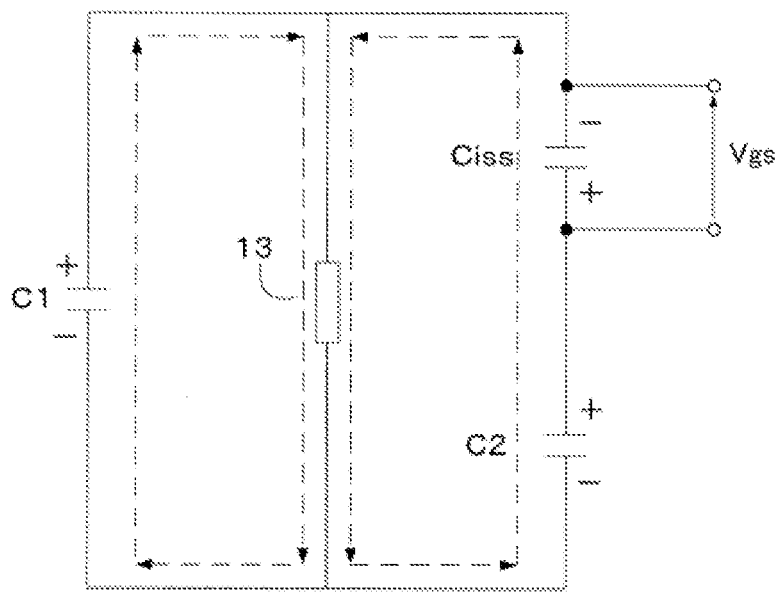

Next, in a period denoted by (C), the electric charge in the capacitor 11 is discharged via the resistor 13. FIG. 6B shows a simple equivalent circuit, in this period, of a current flow path represented by dashed lines with arrows on the gate driving circuit shown in FIG. 6A. In the simple equivalent circuit shown in FIG. 6B, the current flowing through the resistor 13 is represented by dashed lines with arrows. Discharging continues until the electric charge in the capacitor 11 becomes zero. At this time, the switching element 1 is charged in the negative direction, so that the gate voltage Vgs becomes small.

Figure 7A:
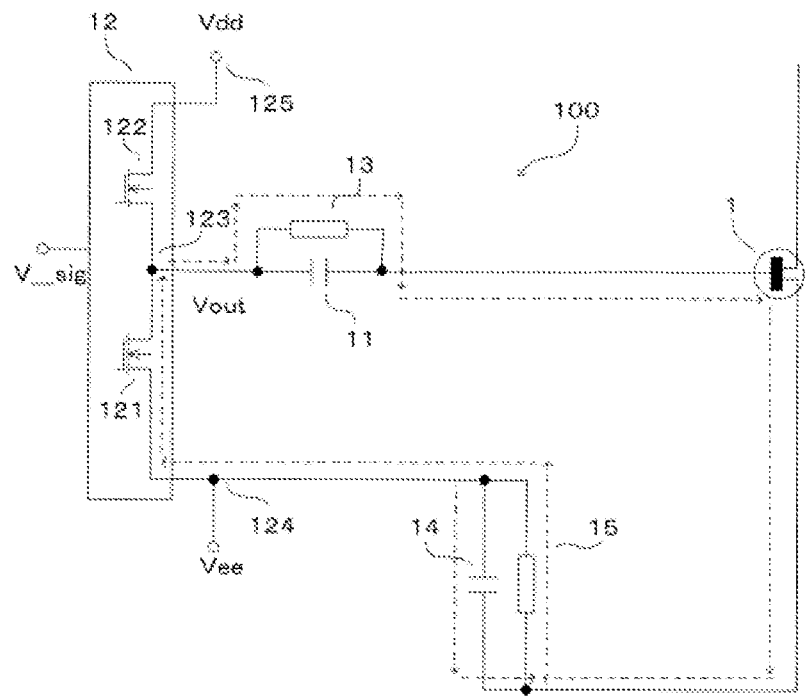
FIGS. 7A and 7B are diagrams showing, in a period (D), a current flow and a simple equivalent circuit of the driving circuit 100.
Figure 7B:
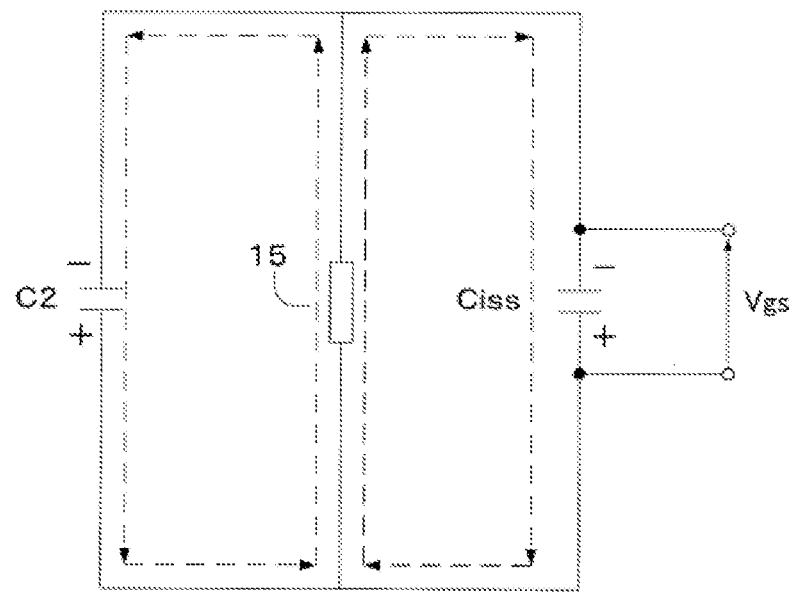

Next, in a period denoted by (D), the electric charge in the capacitor 14 is discharged via the resistor 15. FIG. 7B shows a simple equivalent circuit, in this period, of a current flow path represented by dashed lines with arrows on the gate driving circuit shown in FIG. 7A. The electric charge in the switching element 1 is discharged, so that the gate voltage Vgs increases in the positive direction.

As described above, in the gate driving circuit 100 according to the embodiment, the negative bias voltage value is variable in a manner that depends on a change in the duty cycle. This allows a reduction in loss caused during a dead-time period (during a reverse conduction period) while preventing the switching element 1 from malfunctioning. Further, according to the embodiment, the gate voltage can be regulated with the profile as shown in FIG. 3. The gate voltage is attenuated in two steps when the switching element 1 is in the gate-off state as in the periods (B) and (C), thereby allowing a reduction in gate surge and allowing a reduction in noise.

Second Embodiment

Figure 8:
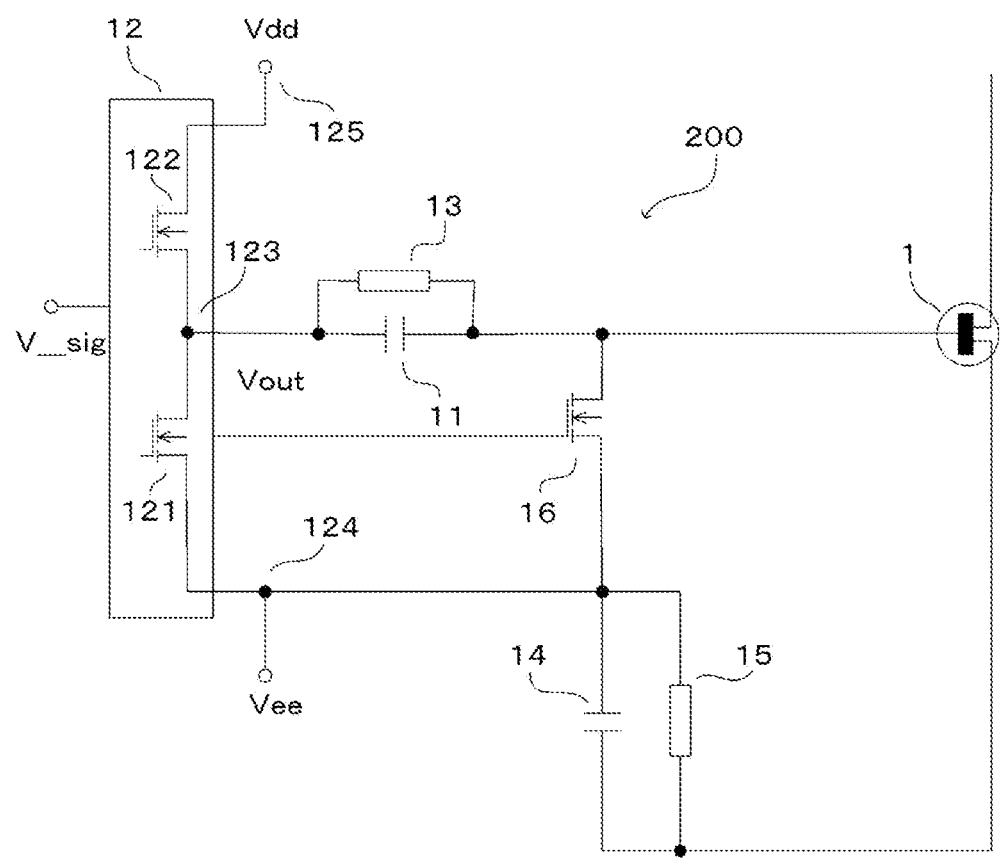
FIG. 8 is a diagram showing a circuit structure of a gate driving circuit 200 according to a second embodiment.

FIG. 8 shows a gate driving circuit 200 according to a second embodiment of the present invention.

The same components as in the first embodiment are denoted by the same reference numerals, and thus no detail description will be given of the components.

According to the embodiment, a switching element 16 is provided between the gate terminal of the switching element 1 and the first ends of the capacitor 11 and resistor 13, and the second ends of the capacitors 14 and resistor 15. Here, an n-channel MOSFET is used as the switching element 16, and the switching element 16 has a drain terminal connected to a section between the gate terminal and the first ends of the capacitor 11 and resistor 13 and a source terminal connected to the second ends of the capacitor 14 and resistor 15. Further, the switching element 16 has a gate terminal connected to the driving circuit 12 and is controlled in accordance with a signal input from the driving circuit 12.

Figure 9:
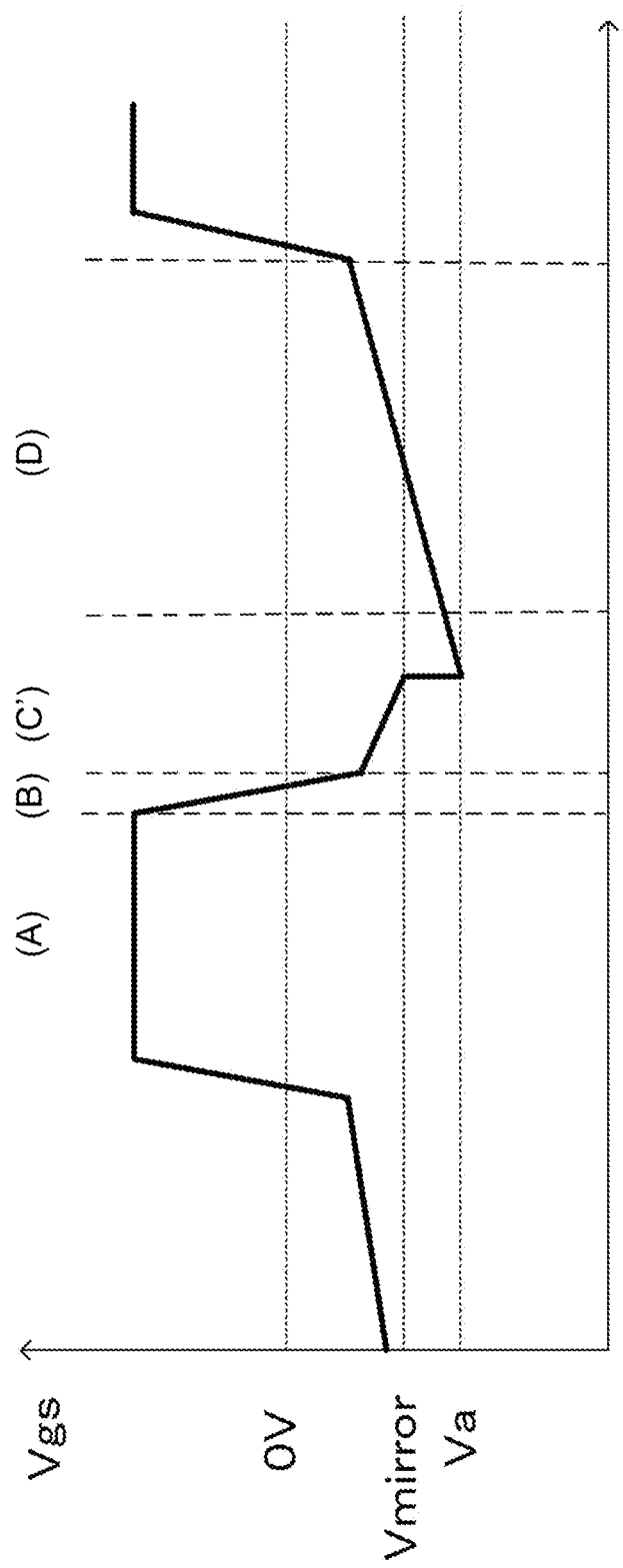
FIG. 9 is a graph showing a profile of a gate voltage applied to the switching element 1 according to the second embodiment.

This switching element 16 serves as a mirror clamping circuit, and when the gate voltage Vgs is equal to or less than a Vmirror voltage (for example, Va(minimum negative bias voltage value)+2 V), the switching element 16 turns on to set Vgs equal to Va. FIG. 9 shows a profile of the gate voltage Vgs applied to the switching element 1 driven by the gate driving circuit 200 according to the embodiment. In a period denoted by (C') shown in FIG. 9, as described above, when the gate voltage Vgs is equal to or less than Vmirror, the gate voltage Vgs is reduced to Va. Accordingly, when the gate driving circuit 200 is used as a gate driving circuit for a switching element of a synchronous rectification converter, the switching element 16 turns on when a switching element of the opposite arm is in the on state so as to increase the negative bias voltage value, thereby preventing malfunctions. This further allows a reduction in conduction loss during the dead-time period.

Third Embodiment

Figure 10:
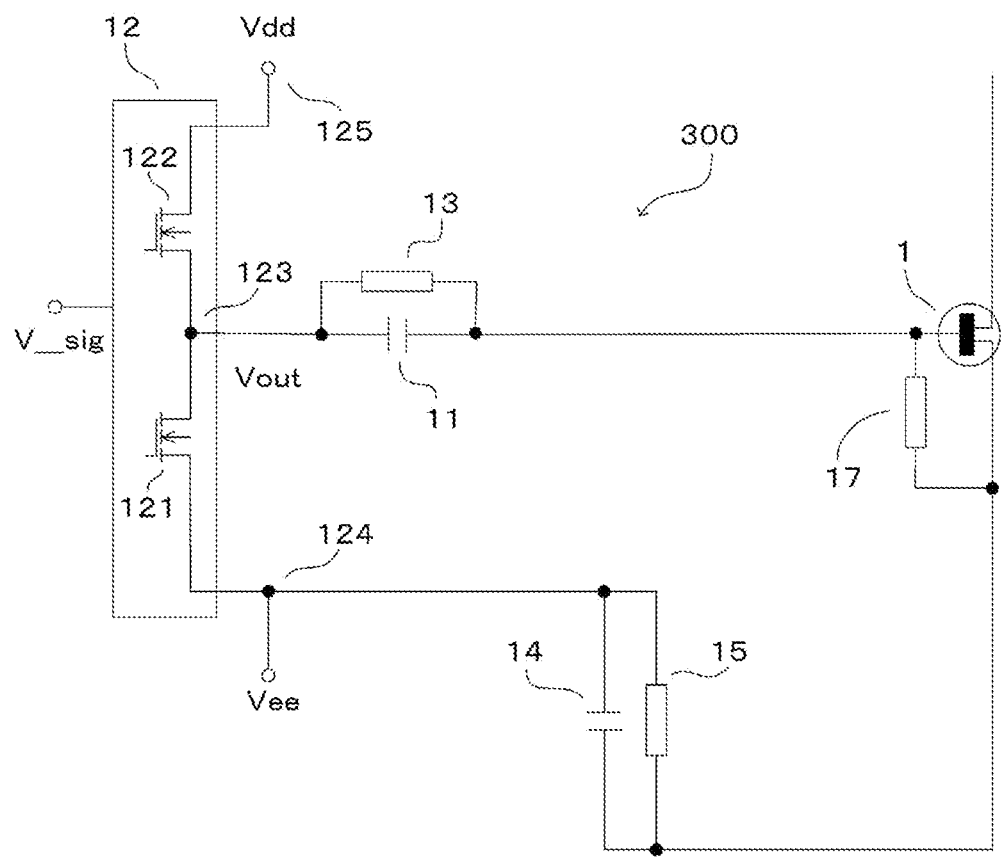
FIG. 10 is a diagram showing a circuit structure of a gate driving circuit 300 according to a third embodiment.

FIG. 10 shows a gate driving circuit 300 according to a third embodiment of the present invention.

The same components as in the first embodiment are denoted by the same reference numerals, and thus no detail description will be given of the components.

According to the embodiment, a resistor 17 is connected in parallel between the gate and source of the switching element 1. The resistor 17 has a first end connected to a section between the gate terminal of the switching element 1 and the first ends of the capacitor 11 and resistor 13. The resistor 17 has a second end connected to a section between the source terminal of the switching element 1 and the first ends of the capacitor 14 and resistor 15.

According to the embodiment, the negative bias voltage value applied to the switching element 1 is variable in a manner that depends on not only the duty cycle as in the first embodiment, but also the resistance value of the resistor 17.

According to the embodiment, a change in the negative bias voltage value applied to the switching element 1 allows a reduction in loss while preventing the switching element 1 from malfunctioning. Herein, the resistor 17 corresponds to a third resistor.

Fourth Embodiment

Figure 11:
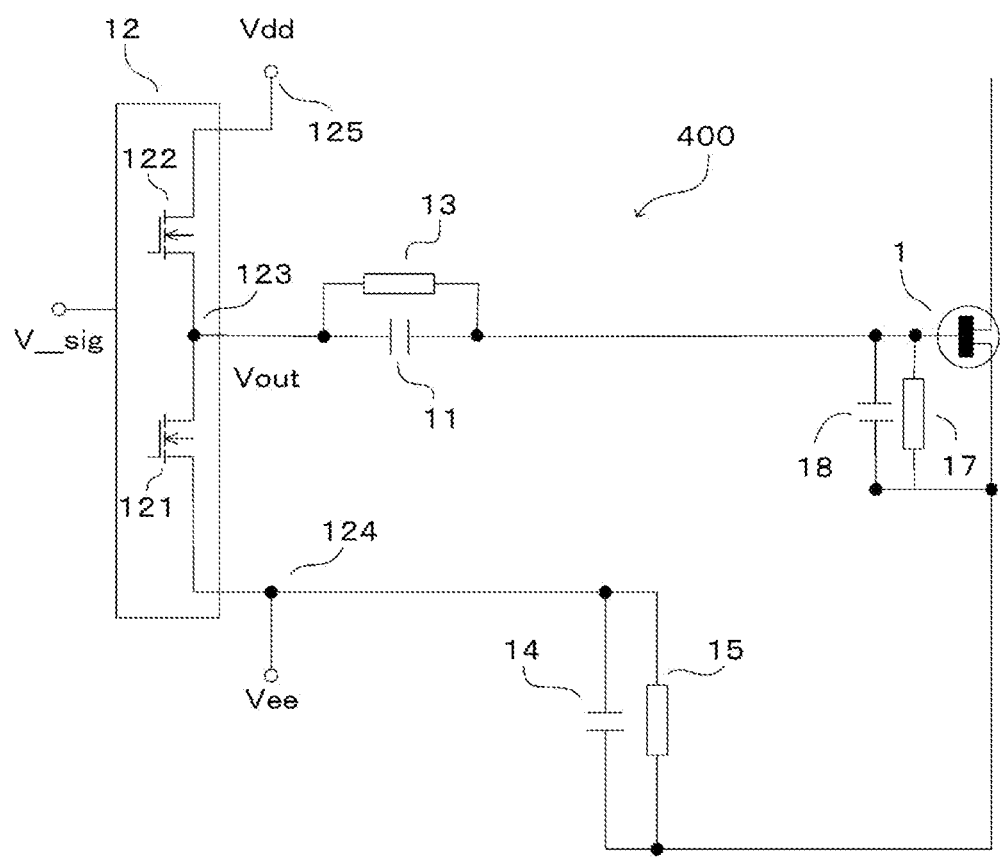
FIG. 11 is a diagram showing a circuit structure of a gate driving circuit 400 according to a fourth embodiment.

FIG. 11 shows a gate driving circuit 400 according to a fourth embodiment of the present invention.

The same components as in the third embodiment are denoted by the same reference numerals, and thus no detail description will be given of the components.

According to the embodiment, a capacitor 18 is connected in parallel to the resistor 17 connected between the gate and the source according to the third embodiment.

According to the embodiment, the negative bias voltage value applied to the switching element 1 is variable in a manner that depends on not only the duty cycle as in the first embodiment or the resistance value of the resistor 17 as in the third embodiment, but also the capacitance value of the capacitor 18. Here, the capacitor 18 corresponds to a third capacitor.

According to the embodiment, a change in the negative bias voltage value applied to the switching element 1 allows a reduction in loss while preventing the switching element 1 from malfunctioning.

This further makes the switching speed of the switching element variable in a manner that depends on the capacitance value of the capacitor 18.

Fifth Embodiment

Figure 12:
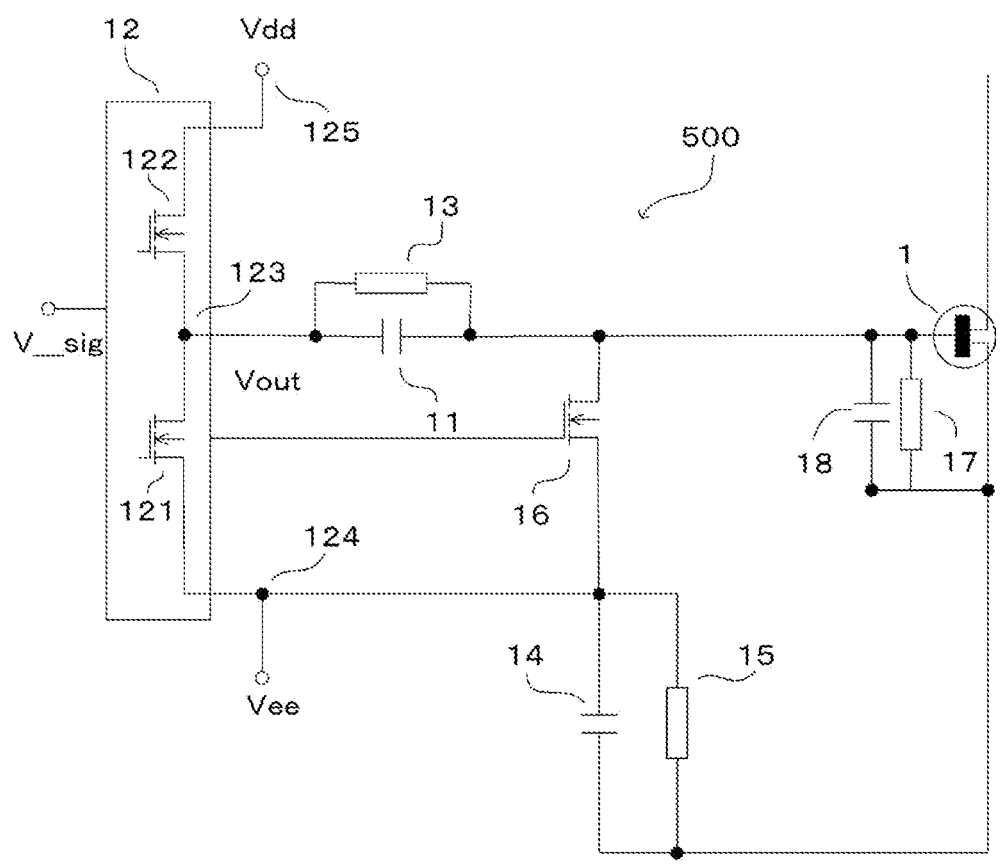
FIG. 12 is a diagram showing a circuit structure of a gate driving circuit 500 according to a fifth embodiment.

FIG. 12 shows a gate driving circuit 500 according to a fifth embodiment of the present invention.

The same components as in the second and fourth embodiments are denoted by the same reference numerals, and thus no description will be given of the components.

According to the embodiment, the switching element 16 is connected in parallel between the gate and source of the switching element 1. The switching element 16 is connected between the first ends of the resistor 17 and capacitor 18 and the first ends of the capacitor 11 and resistor 13, and the second ends of the capacitor 14 and resistor 15. Here, an n-channel MOSFET is used as the switching element 16, and the switching element 16 has a drain terminal connected to a section between the first ends of the resistor 17 and capacitor 18 and the first ends of the capacitor 11 and resistor 13 and a source terminal connected to the second ends of the capacitor 14 and resistor 15. Further, the switching element 16 has a gate terminal connected to the driving circuit 12 and is controlled in accordance with a signal input from the driving circuit 12.

The switching element 16 serves as a mirror clamper. The function of the switching element 16 is the same as the function described according to the second embodiment.

According to the embodiment, when the switching element 16 is provided to cause the gate driving circuit 500 to serve as a gate driving circuit for a switching element of a synchronous rectification converter, increasing the negative bias voltage value when a switching element of the opposite arm is in the on state makes it possible to prevent false turn-on and reduce a gate surge. This further allows a reduction in conduction loss during the dead-time period.

Sixth Embodiment

Figure 13:
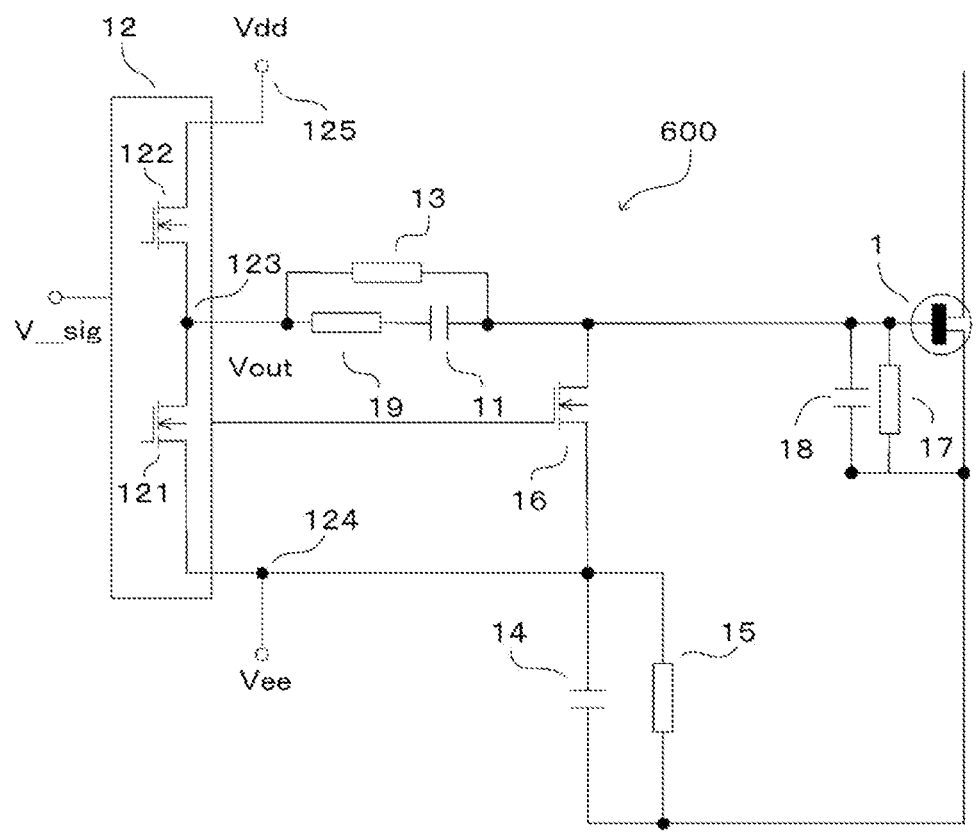
FIG. 13 is a diagram showing a circuit structure of a gate driving circuit 600 according to a sixth embodiment.

FIG. 13 shows a gate driving circuit 600 according to a sixth embodiment of the present invention.

The same components as in the fifth embodiment are denoted by the same reference numerals, and thus no description will be given of the components.

According to the embodiment, a resistor 19 is connected in series with the capacitor 11, and the resistor 13 is connected in parallel to the capacitor 11 and the resistor 19 connected in series. Here, the resistor 19 is connected adjacent to the Vout end 123 of the driving circuit 12 relative to the capacitor 11. Here, the resistor 19 corresponds to a fourth resistor.

According to the embodiment, the switching speed of the switching element 1 is variable in a manner that depends on a change in the resistance value of the resistor 19. This allows reductions in gate surge and switching noise.

Seventh Embodiment

Figure 14:
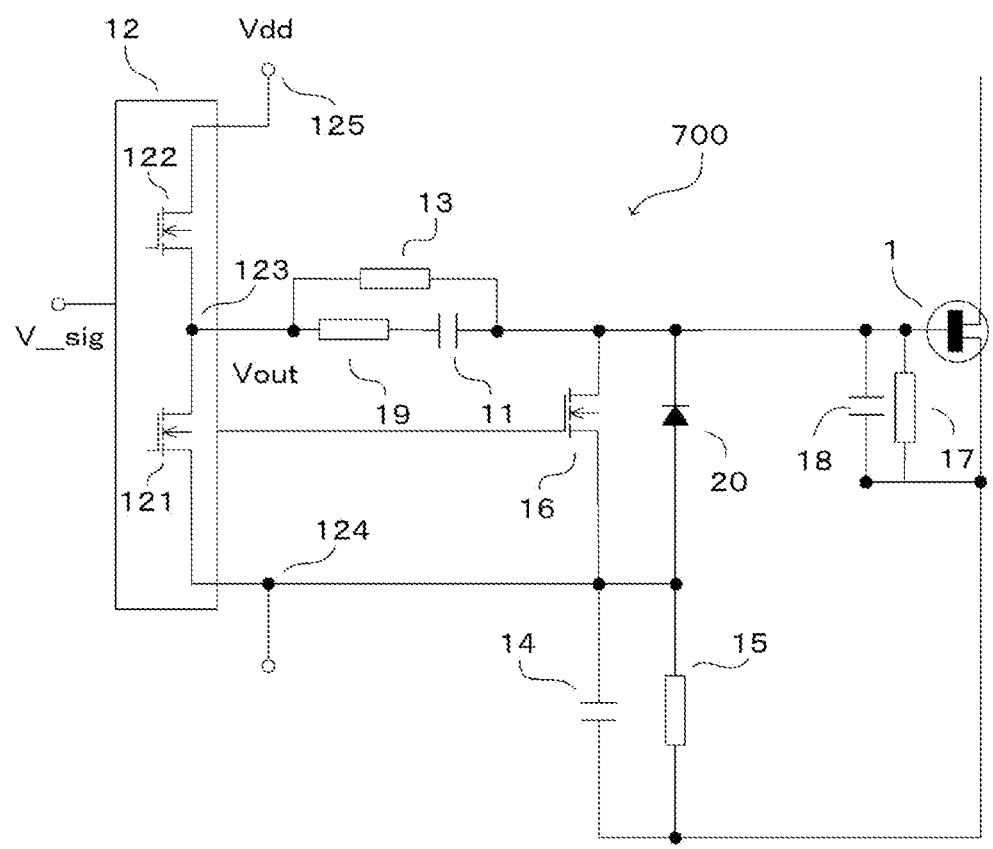
FIG. 14 is a diagram showing a circuit structure of a gate driving circuit 700 according to a seventh embodiment.

FIG. 14 shows a gate driving circuit 700 according to a seventh embodiment of the present invention.

The same components as in the sixth embodiment are denoted by the same reference numerals, and thus no description will be given of the components.

According to the embodiment, a Schottky diode 20 is connected in parallel to the switching element 16 between the first ends of the resistor 17 and capacitor 18 and the first ends of the capacitor 11 and resistor 13, and the second ends of the capacitor 14 and resistor 15. The Schottky diode 20 has a cathode terminal connected to a section adjacent to the gate terminal of the switching element 1 and an anode terminal connected to a section adjacent to the second ends of the capacitor 14 and resistor 15. The addition of the Schottky diode 20 allows a reduction in gate surge.

Eighth Embodiment

Figure 15:
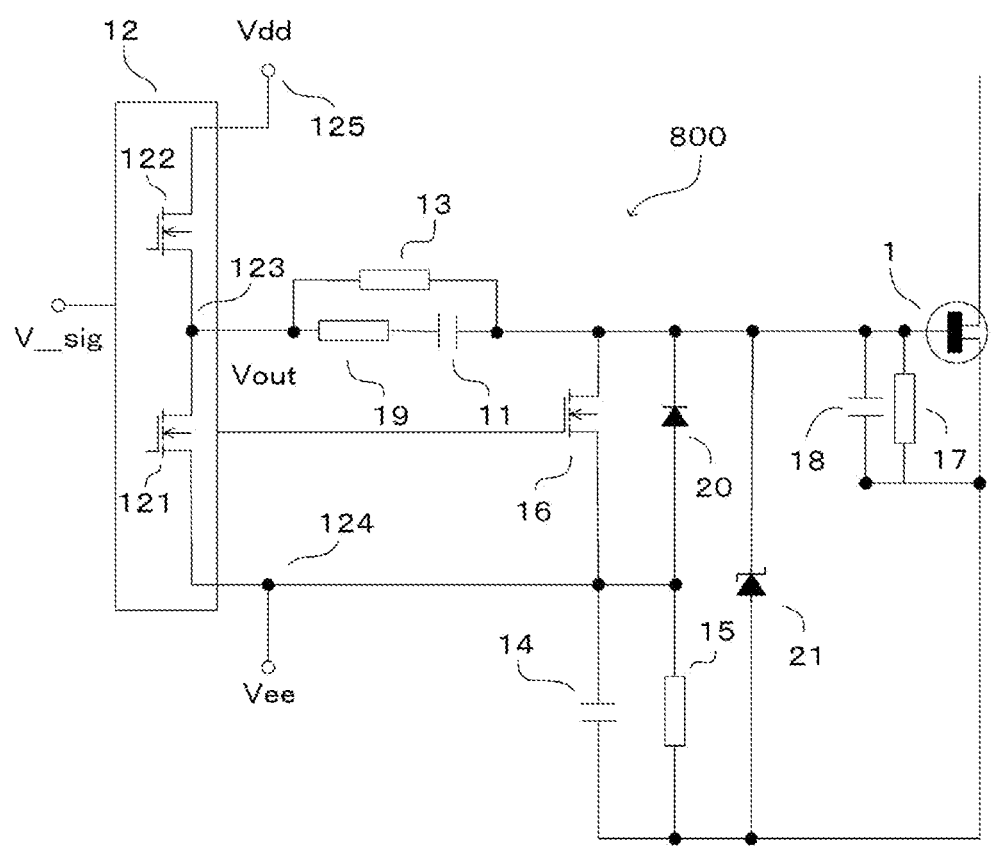
FIG. 15 is a diagram showing a circuit structure of a gate driving circuit 800 according to an eighth embodiment.

FIG. 15 shows a gate driving circuit 800 according to an eighth embodiment of the present invention.

The same components as in the seventh embodiment are denoted by the same reference numerals, and thus no description will be given of the components.

According to the embodiment, a Zener diode 21 is connected between the first ends, adjacent to the gate terminal of the switching element 1, of the resistor 17 and capacitor 18 and the cathode terminal of the Schottky diode 20, and the second terminals, adjacent to the source terminal of the switching element 1, of the resistor 17 and capacitor 18 and the first ends of the capacitor 14 and resistor 15. The Zener diode 21 has a cathode terminal connected to a section adjacent to the gate terminal of the switching element 1 and an anode terminal connected to a section adjacent to the source terminal of the switching element 1. The addition of the Zener diode 21 makes it possible to clamp a gate surge and allows a reduction in gate surge. Here, the Zener diode corresponds to a voltage clamping unit.

[Simulation]

Figure 16:
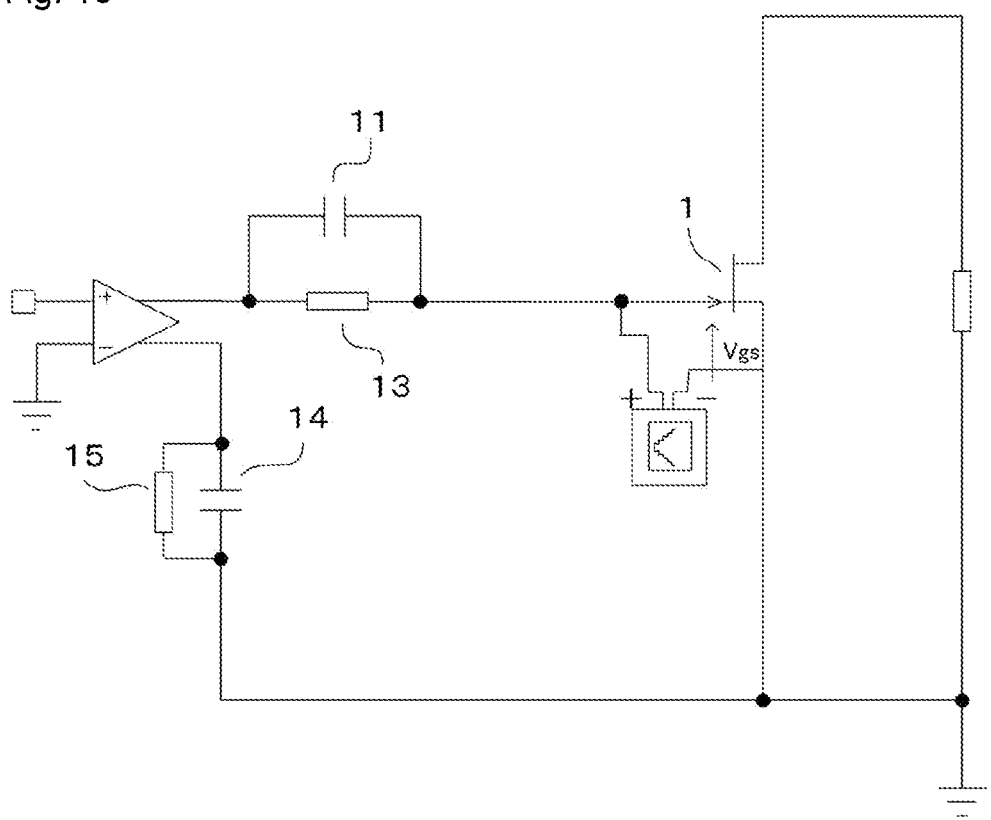
FIG. 16 is a diagram showing a model circuit for simulation.

A gate driving circuit 101 shown in FIG. 16 was created as a model corresponding to the gate driving circuit 100 according to the first embodiment shown in FIG. 1, and a confirmation was made, using circuit simulator software (named SIMetrix), as to whether the negative bias voltage value can be changed in a manner that depends on a change in the duty cycle.

In the circuit simulator, a simulation was performed with the gate voltage set to 12 V, the drive frequency set to 70 kHz, the duty cycle set variable, the resistance value of the resistor 13 set to 82Ω, the resistance value of the resistor 15 set to 168Ω, the capacitance of the capacitor 11 set to 2.2 nF, and the capacitance of the capacitor 14 set to 100 nF.

Figure 17A:
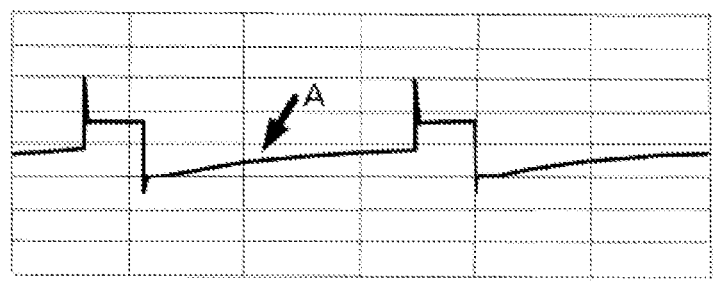
FIGS. 17A to 17D are graphs showing results of simulating a gate voltage applied to a switching element.
Figure 17B:
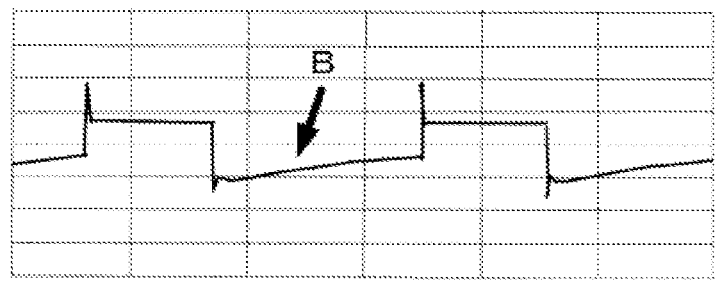
Figure 17C:
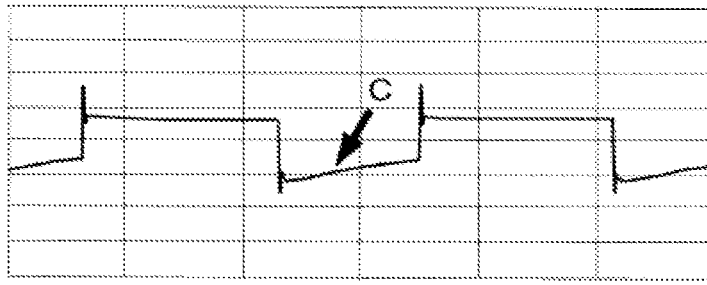
Figure 17D:
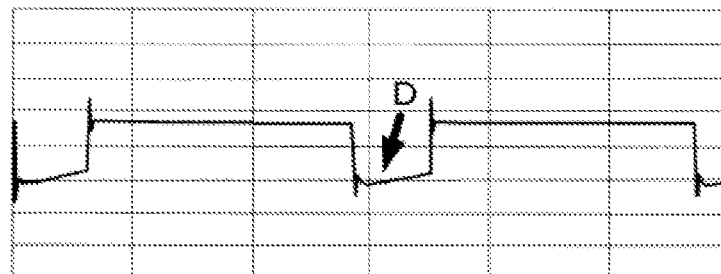

FIGS. 17A to 17D show waveforms representing results of simulating the gate voltage Vgs applied to the switching element 1. FIG. 17A shows a waveform when the duty cycle was set to 20%, FIG. 17B shows a waveform when the duty cycle was set to 40%, FIG. 17C shows a waveform when the duty cycle was set to 60%, and FIG. 17D shows a waveform when the duty cycle was set to 80%. A negative bias voltage value indicated by an arrow A in FIG. 17A was −2.2 V, a negative bias voltage value indicated by an arrow B in FIG. 17B was −3.5 V, a negative bias voltage value indicated by an arrow C in FIG. 17C was −4.3 V, and a negative bias voltage value indicated by an arrow D in FIG. 17D was −5.0 V.

It was thus confirmed, even with the simulation on the model circuit, that the negative bias voltage value can be changed in a manner that depends on a change in the duty cycle.

Next, using the above-described circuit simulator software, a confirmation was made as to whether the negative bias voltage value can be changed in a manner that depends on a change in the resistance value of the resistor 15 in the model circuit shown in FIG. 16.

Figure 18:
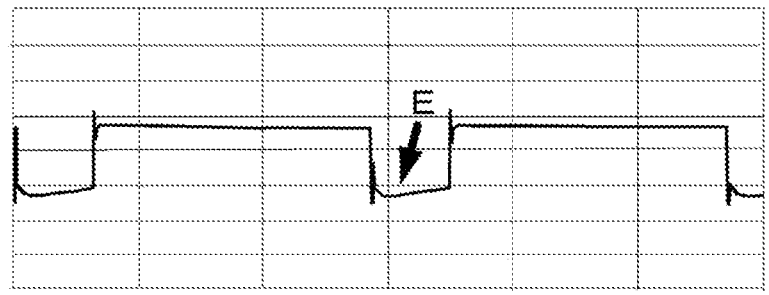
FIG. 18 is a graph showing a different result of simulating the gate voltage applied to the switching element.

Here, the duty cycle was set to 80%, and the same setting as described above was made except for the resistance value of the resistor 15. A simulation with the resistance value of the resistor 15 set to 168Ω and a simulation with the resistance value changed to 500Ω were performed. The case where the resistance value of the resistor 15 was set to 168Ω is the same as shown in FIG. 17D. FIG. 18 shows a waveform representing a result of simulating the gate-source voltage Vgs applied to the switching element when the resistance value of the resistor 15 was set to 500Ω. As shown in FIG. 18, the negative bias voltage value indicated by an arrow E was −7.0 V.

It was thus confirmed, even with the simulation on the model circuit, that the negative bias voltage value can be significantly changed in a manner that depends on a change in the resistance value of the resistor 15.

Ninth Embodiment

Figure 19:
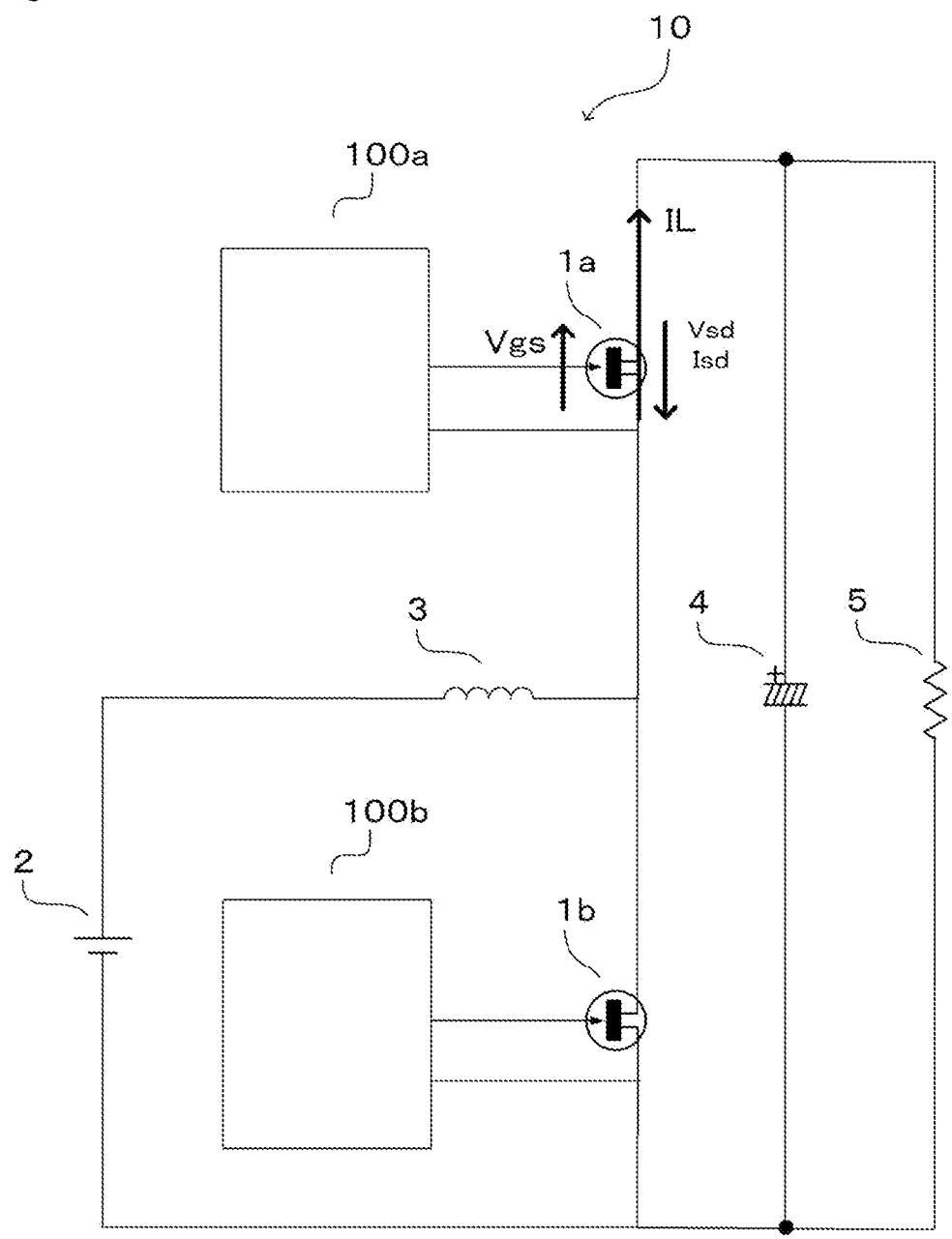
FIG. 19 is a diagram showing a circuit structure of a synchronous rectification boost chopper circuit according to a ninth embodiment.

FIG. 19 shows a synchronous rectification boost chopper circuit 10 according to a ninth embodiment.

The synchronous rectification boost chopper circuit 10 includes switching elements 1a, 1b, gate driving circuits 100a, 100b, an input power supply 2, a reactor 3, a bypass capacitor 4, a load 5, and the like. In the synchronous rectification boost chopper circuit 10, the two switching elements 1a, 1b are connected in series, and the gate driving circuits 100a, 100b are connected to the switching elements 1a, 1b, respectively. The gate driving circuit is not limited to the gate drive device according to the first embodiment, and the gate driving circuit according to another embodiment may be used. Since the function of the synchronous rectification boost chopper circuit 10 is known, no detailed description will be given of the synchronous rectification boost chopper circuit.

Figure 20A:
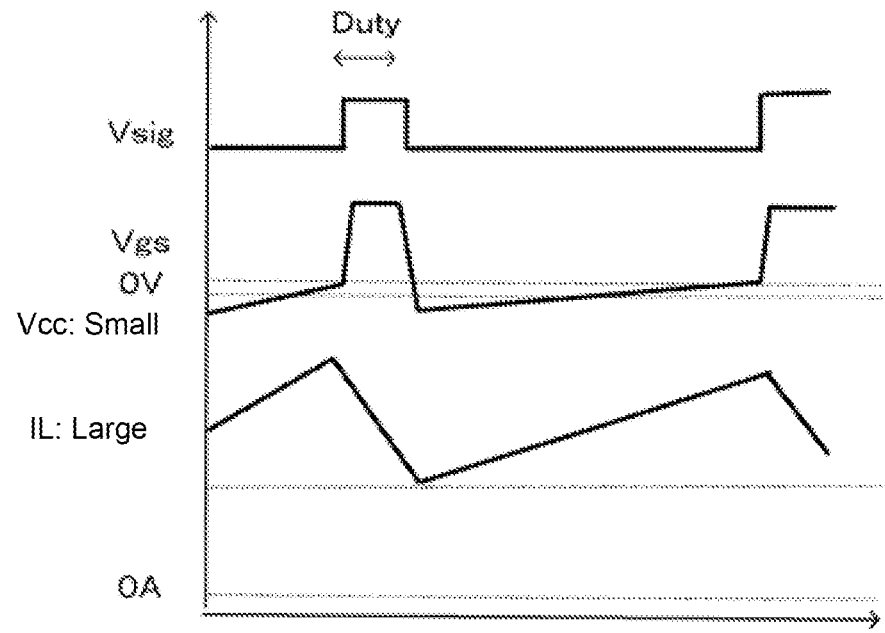
FIGS. 20A and 20B are graphs for describing the operation of the gate driving circuit with different duty cycles.
Figure 20B:
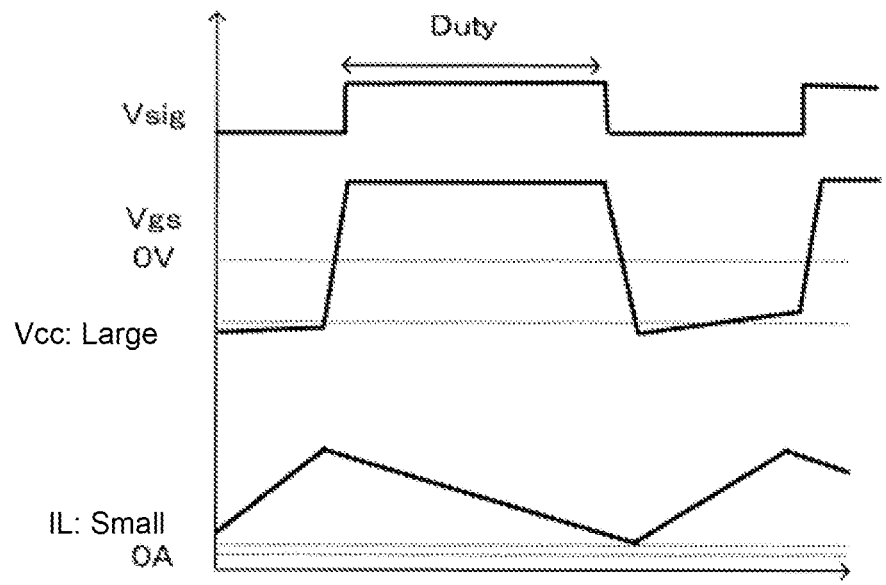

FIG. 20A shows a case where the duty cycle applied to the high-side switching element 1a is small, and FIG. 20B shows a case where the duty cycle applied to the high-side switching element 1b is large. As shown in FIG. 20A, when the duty cycle applied to the high-side switching element is small, a current IL becomes large. At this time, since the duty cycle is small, the negative bias voltage Vcc becomes small accordingly, thereby allowing a reduction in conduction loss. When the negative bias voltage (−Va) is applied to the switching element 1a, a conduction loss when the switching element 1a is in the off state is expressed by the following equation:

$$Vsd*Isd=(Vsd(@Vgs=0)+Va)*Isd \qquad \text{[Math. 10]}$$

where, Vsd(@Vgs=0) denotes a value of Vsd when Vgs is zero, and Vcc denotes an average value of Va.

As can be seen from the above-described equation for conduction loss, even when the current IL is large, the conduction loss can be reduced through a reduction in the negative bias voltage Va, that is, Vcc. As shown in 20B, when the duty cycle applied to the high-side switching element is large, the negative bias voltage value Vcc applied to the switching element 1a also becomes large, but in this case, the current IL becomes small, so that the effect of reducing the conduction loss is not impaired.

Further, even when noise is caused due to a switching operation of another switching element, a configuration where the negative bias voltage value is increased at required timing without increasing Vcc that is the average value of the negative bias voltage allows a reduction in loss while preventing malfunctions.

As described above, the use of one of the gate driving according to the above-described embodiments as the gate driving circuit for the switching element 1 of the synchronous rectification boost chopper circuit 10 allows a reduction in loss while preventing the switching element 1 from malfunctioning, thereby making the synchronous rectification boost chopper circuit 10 high in reliability and efficiency.

Here, the synchronous rectification boost chopper circuit has been described as an example, but the present invention is applicable to any switching circuit in which a plurality of switching elements driven by one of the gate driving circuits according to the embodiments of the present invention are connected in series, such as a DC/DC converter or an inverter.

Note that, in order to allow a comparison between the configuration requirement of the present invention and the configuration of each of the embodiments, the configuration requirement of the present invention will be described with the reference numerals used in the drawings.

<First Invention>

A driving circuit for a switching element (100, 200, 300, 400, 500, 600, 700, 800) configured to drive a switching element (1) of a current-driven type includes a controller (12) having a first terminal (123) and a second terminal (124), the controller (12) being configured to output a control signal to a gate terminal of the switching element (1), a first resistor (13) connected to the first terminal (123) of the controller (12), the first resistor (13) regulating a current serving as the control signal, a first capacitor (11) connected in parallel to the first resistor (13), a second resistor (15), a second capacitor (14) connected in parallel to the second resistor (15), and a current path extending from the first resistor (13) and the first capacitor (11) to the gate terminal and from a source terminal of the switching element (1) to the second terminal (124) of the controller (12), and the second resistor (15) and the second capacitor (14) are put in the path.

<Second Invention>

In the driving circuit for a switching element according to the first invention, when a capacitance of the first capacitor (11) is denoted by C1, a capacitance of the second capacitor (14) is denoted by C2, an input capacitance of the switching element (1) is denoted by Ciss, a source voltage of the control signal is denoted by Vdd, a gate-source voltage when the switching element (1) is in a turn-on state is denoted by Vdev, and a negative bias voltage applied to the switching element (1) is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \quad [\text{Math. 11}]$$

is satisfied.

<Third Invention>

The driving circuit for a switching element according to the first or second invention further includes a third resistor (17) connected between the gate terminal and the source terminal of the switching element (1).

<Fourth Invention>

The driving circuit for a switching element according to the first or second invention further includes a third capacitor (18) connected between the gate terminal and the source terminal of the switching element (1).

<Fifth Invention>

The driving circuit for a switching element according to the first or second invention further includes a mirror clamping circuit (16) provided in parallel to a path including the switching element (1).

<Sixth Invention>

The driving circuit for a switching element according to the first or second invention further includes a fourth resistor (19) connected to the path in series with the first capacitor (11) and in parallel to the first resistor (13).

<Seventh Invention>

The driving circuit for a switching element according to the first or second invention further includes a Schottky diode (20) having a cathode terminal connected to a path adjacent to the first resistor (13) and the first capacitor (11) and an anode terminal connected to a path adjacent to the controller (12), relative to the second resistor (15), the second capacitor (14), and the switching element (1).

<Eighth Invention>

The driving circuit for a switching element according to the first or second invention further includes a voltage clamping unit (21) connected in parallel to the switching element (1), the voltage clamping unit being configured to fix a voltage to a predetermined voltage.

<Ninth Invention>

A switching circuit (10) includes a plurality of switching elements (1) of a current-driven type connected in series, and the driving circuit for a switching element (100, 200, 300, 400, 500, 600, 700, 800) according to any one of the first to eighth inventions configured to drive each of the plurality of switching elements (1).

DESCRIPTION OF SYMBOLS 1 switching element
11, 14, 18 capacitor
12 driving circuit
123 Vout end
124 Vee end
13, 15, 17, 19 resistor
100 gate driving circuit
16 switching element
20 Schottky diode
21 Zener diode
10 synchronous rectification boost chopper

The invention claimed is:

1. A driving circuit for a switching element configured to drive a switching element of a current-driven type, the driving circuit for a switching element comprising:
a controller comprising a first terminal and a second terminal, the controller being configured to output a control signal to a gate terminal of the switching element;
a first resistor connected to the first terminal of the controller, the first resistor regulating a current serving as the control signal;
a first capacitor connected in parallel to the first resistor;
a second resistor;
a second capacitor connected in parallel to the second resistor; and
a current path extending from the first resistor and the first capacitor to the gate terminal and from a source terminal of the switching element to the second terminal of the controller, wherein
the second resistor and the second capacitor are put in the path, and
when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \quad [\text{Math. 1}]$$

is satisfied.

2. The driving circuit for a switching element according to claim 1, further comprising a third resistor connected between the gate terminal and the source terminal of the switching element.

3. The driving circuit for a switching element according to claim 1, further comprising a third capacitor connected between the gate terminal and the source terminal of the switching element.

4. The driving circuit for a switching element according to claim 1, further comprising a mirror clamping circuit provided in parallel to a path comprising the switching element.

5. The driving circuit for a switching element according to claim 1, further comprising a fourth resistor connected to the path in series with the first capacitor and in parallel to the first resistor.

6. The driving circuit for a switching element according to claim 1, further comprising a Schottky diode comprising a cathode terminal connected to a path adjacent to the first resistor and the first capacitor and an anode terminal connected to a path adjacent to the controller, relative to the second resistor, the second capacitor, and the switching element.

7. The driving circuit for a switching element according to claim 1, further comprising a voltage clamping unit connected in parallel to the switching element, the voltage clamping unit being configured to fix a voltage to a predetermined voltage.

8. A switching circuit comprising:
a plurality of switching elements of a current-driven type connected in series; and
the driving circuit for a switching element according to claim 1 configured to drive each of the plurality of switching elements.

* * * * *